United States Patent
Cho et al.

(10) Patent No.: US 11,217,625 B2
(45) Date of Patent: Jan. 4, 2022

(54) DISPLAY MODULE INCLUDING MICRO LIGHT-EMITTING DIODES AND REFLECTIVE LAYER, DISPLAY APPARATUS INCLUDING THE SAME AND METHOD OF MANUFACTURING DISPLAY MODULE

(71) Applicant: SAMSUNG ELECTRONICS CO., LTD., Suwon-si (KR)

(72) Inventors: Jinhyun Cho, Suwon-si (KR); Heungbom Kim, Suwon-si (KR); Hojin Yu, Suwon-si (KR); Wonyong Lee, Suwon-si (KR); Hyounggil Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/704,434

(22) Filed: Dec. 5, 2019

(65) Prior Publication Data
US 2020/0185453 A1 Jun. 11, 2020

(30) Foreign Application Priority Data
Dec. 10, 2018 (KR) .......................... 10-2018-0158562

(51) Int. Cl.
| | | |
|---|---|---|
| H01L 29/20 | (2006.01) | |
| H01L 27/15 | (2006.01) | |
| F21V 7/00 | (2006.01) | |
| F21K 9/00 | (2016.01) | |
| H01L 33/60 | (2010.01) | |

(52) U.S. Cl.
CPC ............ *H01L 27/156* (2013.01); *F21K 9/00* (2013.01); *F21V 7/00* (2013.01); *H01L 33/60* (2013.01)

(58) Field of Classification Search
CPC ................................ H01L 27/156; F21K 9/00
See application file for complete search history.

(56) References Cited

U.S. PATENT DOCUMENTS

| | | | |
|---|---|---|---|
| 7,427,145 B2 | 9/2008 | Jang et al. | |
| 7,514,723 B2 | 4/2009 | Arndt et al. | |
| 8,273,800 B2 | 9/2012 | Holloway | |
| 9,874,316 B2 | 1/2018 | Yu et al. | |
| 10,304,813 B2* | 5/2019 | Kuo ....................... H01L 33/48 |

(Continued)

FOREIGN PATENT DOCUMENTS

| | | |
|---|---|---|
| CN | 100587982 C | 2/2010 |
| JP | 7-142820 A | 6/1995 |

(Continued)

OTHER PUBLICATIONS

International Search Report (PCT/ISA/210) dated Mar. 17, 2020 issued by the International Searching Authorithy in International Application No. PCT/KR2019/016903.

(Continued)

*Primary Examiner* — Caleb E Henry
(74) *Attorney, Agent, or Firm* — Sughrue Mion, PLLC

(57) ABSTRACT

A display module is disclosed. The display module includes a substrate, a plurality of micro light-emitting diodes (micro-LEDs) disposed on the substrate and configured to radiate light, a reflective layer surrounding a lateral surface of each of the plurality of micro-LEDs, and a light blocking layer disposed on the reflective layer.

14 Claims, 15 Drawing Sheets

(56) References Cited

U.S. PATENT DOCUMENTS

| | | |
|---|---|---|
| 10,804,250 B2 | 10/2020 | Liu et al. |
| 10,811,567 B2 | 10/2020 | Lim et al. |
| 2002/0131145 A1* | 9/2002 | Lin .................. H01L 33/62 |
| | | 359/248 |
| 2009/0262520 A1 | 10/2009 | Park et al. |
| 2012/0235169 A1 | 9/2012 | Seko et al. |
| 2015/0054008 A1 | 2/2015 | Rhee |
| 2017/0358624 A1 | 12/2017 | Takeya et al. |
| 2018/0076368 A1 | 3/2018 | Hussell |
| 2018/0190631 A1 | 7/2018 | Kim et al. |
| 2018/0358339 A1 | 12/2018 | Iguchi |
| 2019/0164945 A1* | 5/2019 | Chae .................. H01L 27/156 |
| 2019/0189596 A1* | 6/2019 | Chae .................. H01L 33/50 |
| 2019/0198485 A1* | 6/2019 | Chae .................. H01L 33/382 |
| 2019/0198565 A1* | 6/2019 | Lee .................... G09G 3/32 |
| 2019/0244939 A1 | 8/2019 | Liu et al. |
| 2019/0252358 A1* | 8/2019 | Yoo .................. H01L 25/0753 |
| 2020/0091376 A1 | 3/2020 | Lim et al. |

FOREIGN PATENT DOCUMENTS

| | | |
|---|---|---|
| JP | 2000-206906 A | 7/2000 |
| JP | 2015-132788 A | 7/2015 |
| JP | 6038175 B2 | 12/2016 |
| KR | 10-0935869 B1 | 1/2010 |
| KR | 10-2011-0031151 A | 3/2011 |
| KR | 10-1093324 B1 | 12/2011 |
| WO | 2017/094461 A1 | 8/2017 |
| WO | 2017/150910 A1 | 9/2017 |
| WO | 2018/077058 A1 | 5/2018 |

OTHER PUBLICATIONS

Written Opinion (PCT/ISA/237) dated Mar. 17, 2020 issued by the International Searching Authority in International Application No. PCT/KR2019/016903.

Communication dated Oct. 18, 2021, issued by the European Patent Office in counterpart European Application No. 19894800.2.

* cited by examiner

DISPLAY MODULE INCLUDING MICRO LIGHT-EMITTING DIODES AND REFLECTIVE LAYER, DISPLAY APPARATUS INCLUDING THE SAME AND METHOD OF MANUFACTURING DISPLAY MODULE

CROSS-REFERENCE TO RELATED APPLICATION(S)

This application is based on and claims priority under 35 U.S.C. § 119 to Korean Patent Application No. 10-2018-0158562, filed on Dec. 10, 2018, in the Korean Intellectual Property Office, the disclosure of which is incorporated by reference herein in its entirety

BACKGROUND

1. Field

Apparatuses and methods consistent with the disclosure relate to a display module having improved luminance and heat emission performance, a display apparatus including the same, and a method of manufacturing the display module.

2. Description of Related Art

A micro light-emitting diode (micro-LED) is an ultra-small inorganic light-emitting material that emits light, and might not require a color filter or a backlight to do so. Specifically, the micro-LED may refer to an ultra-small LED having a length that is $\frac{1}{10}^{th}$ of the length of a general LED chip, and an area that is $\frac{1}{100}^{th}$ the area of a general LED chip. Further, a micro-LED may have a width, a length, and a height of 10 to 100 micrometers (μm).

A display screen may be implemented by disposing the micro-LED on a substrate of a display to radiate light in a forward direction. However, the micro-LED may radiate light from its lateral surface as well as from its upper surface to be directed forward, and thus, it may be difficult to use the light of the micro-LED that is radiated from its lateral surface in implementing the display screen. Accordingly, the light efficiency of the micro-LED may decrease, and the power consumption of the display device may increase.

In addition, to the micro-LED and/or the electronic components disposed near the micro-LED may be damaged based on the heat generated from the micro-LED when the micro-LED emits light.

SUMMARY

Embodiments of the disclosure may overcome the above disadvantages and other disadvantages not described above. Also, the disclosure is not required to overcome the disadvantages described above, and an embodiment of the disclosure may not overcome any of the problems described above.

The disclosure provides a display module having improved luminance and heat emission performance, a display apparatus including the same, and a method of manufacturing the display module.

Additional aspects will be set forth in part in the description which follows and, in part, will be apparent from the description, or may be learned by practice of the presented embodiments.

According to an aspect of the disclosure, a display module includes a substrate; a plurality of micro light-emitting diodes (micro-LEDs) disposed on the substrate, and configured to radiate light; a reflective layer surrounding a lateral surface of each of the plurality of micro-LEDs; and a light blocking layer disposed on the reflective layer.

The reflective layer may be comprised of boron nitride.

The reflective layer and the light blocking layer may be disposed to expose upper surfaces of the plurality of micro-LEDs.

An upper surface of the reflective layer may be lower than or planar with upper surfaces of the plurality of micro-LEDs.

The display module may include a plurality of soldering members configured to electrically connect the plurality of micro-LEDs and the substrate, and the reflective layer may be formed on the substrate to fill spaces between the plurality of soldering members.

The light blocking layer may be disposed on the reflective layer between the plurality of micro-LEDs.

The reflective layer may be disposed to fill spaces between the plurality of micro-LEDs, and the light blocking layer may be disposed on an upper surface of the reflective layer.

The light blocking layer may be disposed between the plurality of micro-LEDs that are surrounded by the reflective layer.

The plurality of micro-LEDs may include a first micro-LED configured to emit red light; a second micro-LED configured to emit green light; and a third micro-LED configured to emit blue light.

The first micro-LED, the second micro-LED, and the third micro-LED may be disposed sequentially on the substrate.

A display apparatus may include a plurality of display modules; an array plate configured to support the plurality of display modules to permit the plurality of display modules disposed on the same plane in parallel with each other; and a housing configured to fix the plurality of display modules and the array plate. Each of the plurality of display modules may include a substrate; a plurality of micro light-emitting diodes (micro-LEDs) disposed on the substrate, and configured to radiate light; a reflective layer surrounding a lateral surface of each of the plurality of micro-LEDs; and a light blocking layer disposed on the reflective layer.

The reflective layer may be comprised of boron nitride.

The reflective layer and the light blocking layer may be disposed to expose upper surfaces of the plurality of micro-LEDs.

The reflective layer may fill spaces between the plurality of display modules.

A method of manufacturing a display module may include providing a plurality of micro light-emitting diodes (micro-LEDs) on a substrate; forming a reflective layer on the substrate to surround a lateral surface of each of the plurality of micro-LEDs; heat-curing the reflective layer; and forming a light blocking layer on the reflective layer.

During the forming of the reflective layer, the reflective layer may be integrally applied onto the substrate to surround the lateral surfaces of each of the plurality of micro-LEDs.

The method of manufacturing may include polishing portions of the reflective layer and the light locking layer disposed above the plurality of micro-LEDs to expose upper surfaces of the plurality of micro-LEDs.

During the polishing, the polishing may be performed such that the respective upper surfaces of the plurality of micro-LEDs, the reflective layer, and the light blocking layer are planarized.

During the forming of the reflective layer, a liquid-phase reflective layer may be injected onto the substrate to surround lateral surfaces of the plurality of micro-LEDs.

During the forming of the reflective layer, the reflective layer may be formed to fill spaces between the plurality of micro-LEDs, and the light blocking layer may be formed on the reflective layer formed between the plurality of micro-LEDs.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

In order to fully understand the constitutions and effects of the disclosure, the embodiments of the disclosure will be described with reference to the accompanying drawings. However, the disclosure is not limited to the embodiments which will be described below, and may be implemented in various forms according to various modifications. The embodiments disclosed herein are provided for those skilled in the art to understand the disclosure and the scope of the disclosure. In the accompanying drawings, elements may be exaggerated in size for convenience of explanation, and the proportions of the elements may be exaggerated or reduced.

It should be understood that when an element is referred to as being "on" or "in contact with" another element, the element may be in contact with or connected to the another element in a direct manner or via an intervening element. It should be understood that when an element is referred to as being "directly on" or "directly in contact with" another element, there may be no intervening elements. Other expressions for explaining the relationship among elements, for example, "between" and "directly between" may be interpreted similarly.

It should be understood that although the terms "first," "second," and the like, may be used herein to describe various elements, these elements should not be limited by these terms. These terms may be used to distinguish one element from another element. For example, the "first" element may be referred to as the "second" element, and similarly, the "second" element may also be referred to as the "first" element, without departing from the scope of the disclosure.

Singular forms of terms may include the plural forms of the terms unless the context clearly indicates otherwise. Terms such as "include," "have," and the like, may be used to indicate the presence of features, numerals, steps, operations, components, parts, or combinations thereof, mentioned in the specification, but it should also be understood that one or more other features, numerals, steps, operations, components, parts, or combinations thereof may be added.

The terms used to describe the embodiments of the disclosure may be construed based on their meanings as known to those skilled in the art unless otherwise defined.

Hereinafter, the structure of a display apparatus 1 according to the disclosure will be described with reference to FIG. 1.

Figure 1:
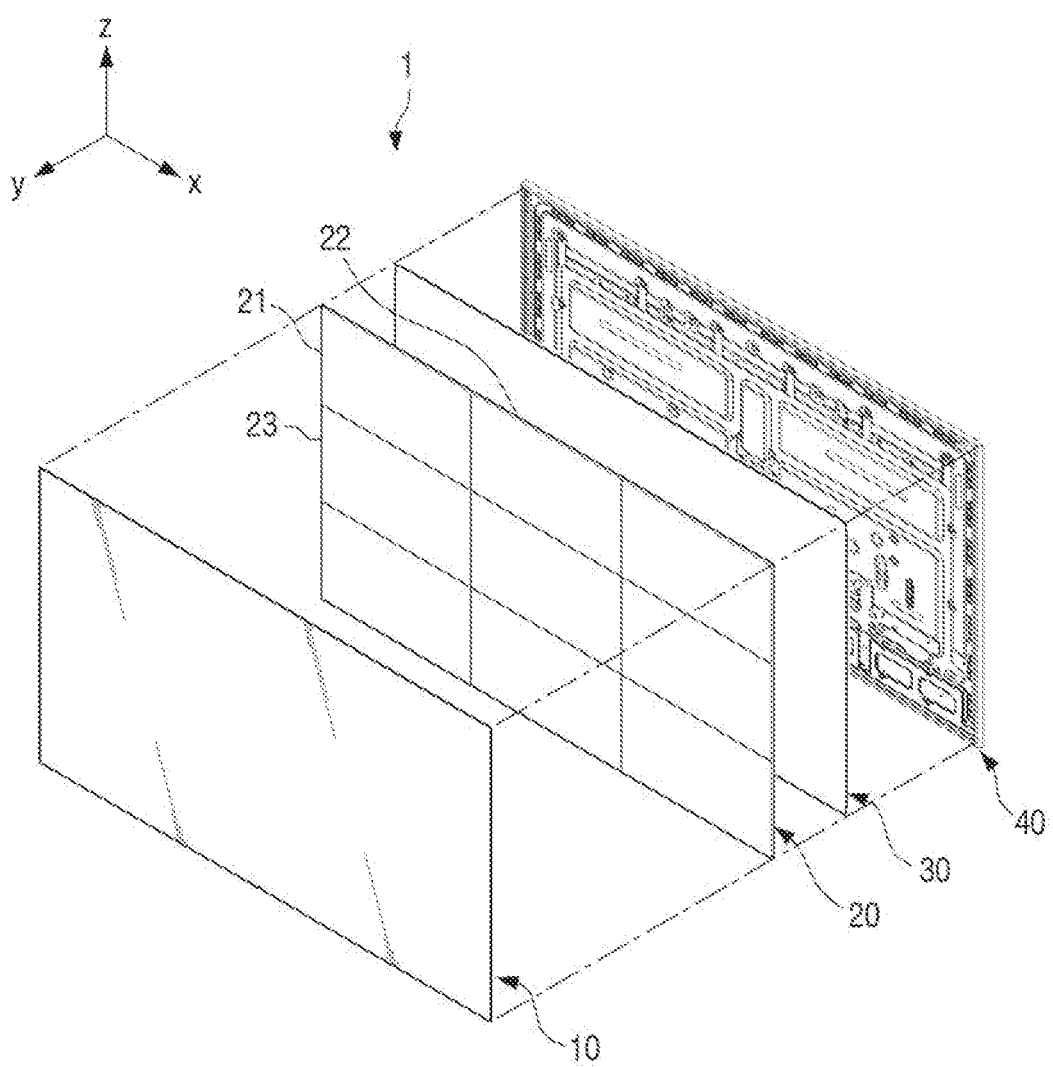
FIG. 1 is an exploded perspective view illustrating a display apparatus according to an embodiment.

FIG. 1 is an exploded perspective view illustrating a display apparatus 1 according to an embodiment of the disclosure.

The display apparatus 1 may be a device configured to process an image signal received from an external source and visually display the processed image, and may be implemented in various forms, such as a television, a monitor, a portable multimedia device, a portable communication device, and the like.

A protective plate 10 may be disposed on a front surface (in a Y-axis direction) of the display apparatus 1, and may protect a plurality of display modules 20 disposed behind the protective plate 10 from external disturbances.

The protective plate 10 may be comprised of a glass material having a thin thickness, or comprised of any various materials.

The plurality of display modules 20 may be configured to display an image in a forward direction (in the Y-axis direction) based on an image signal received from an external source.

In addition, the plurality of display modules 20 may implement a display screen. For example, each display module 20 may be manufactured based on a size of the display to be implemented, and may be arranged to implement the display screen.

For example, when first and second display modules 21 and 22 are arranged in a side by side manner in a transverse direction (X-axis direction), the display screen may be implemented to be longer in the transverse direction (X-axis direction) than in a longitudinal direction (Z-axis direction).

In addition, when the first and third display modules 21 and 23 are arranged in a side by side manner in the longitudinal direction (Z-axis direction), the display screen may be implemented to be longer in the longitudinal direction (Z-axis direction) than the transverse direction (X-axis direction).

Therefore, the display screen may be implemented in various sizes and forms based on the number and the form of a plurality of display modules 20 arranged to form the display screen.

The display module 20 will be described in more detail elsewhere herein with reference to FIGS. 2 and 3.

An array plate 30 may be a plate on which the plurality of display modules 20 may be disposed, and is disposed on rear surfaces of the plurality of display modules 20. The array plate 30 may be formed as a flat plate, and may be formed in various forms and sizes based on the form and size of the plurality of display modules 20.

Accordingly, the array plate 30 may support the plurality of display modules 20 such that the plurality of display modules 20 are disposed in parallel with each other on the same plane, and implement the same height between the display modules 20 and the uniform luminance of the display screen.

A housing 40 may form an appearance of the display apparatus 1, may be disposed behind the array plate 30, and may stably fix the plurality of display modules 20 and the array plate 30.

In addition, the housing 40 may stably fix an edge region of the protective plate 10.

Accordingly, the housing 40 may prevent various components included in the display apparatus 1 from being externally exposed, and protect the various components included in the display apparatus 1 from external impacts.

Hereinafter, the specific structure and operation of the display module 20 will be described with reference to FIGS. 2 and 3.

The display module 20 according to an embodiment of the disclosure may be applied to an electronic product or an electronic device that implements a wearable device, a portable device, a handheld device, or various displays, in a single unit. The display module may also be applied to a small display device such as a monitor for a personal computer, a TV, etc., and a large display device such as a digital sign, an electronic display including a plurality of assembly arrangements, and the like.

Figure 2:
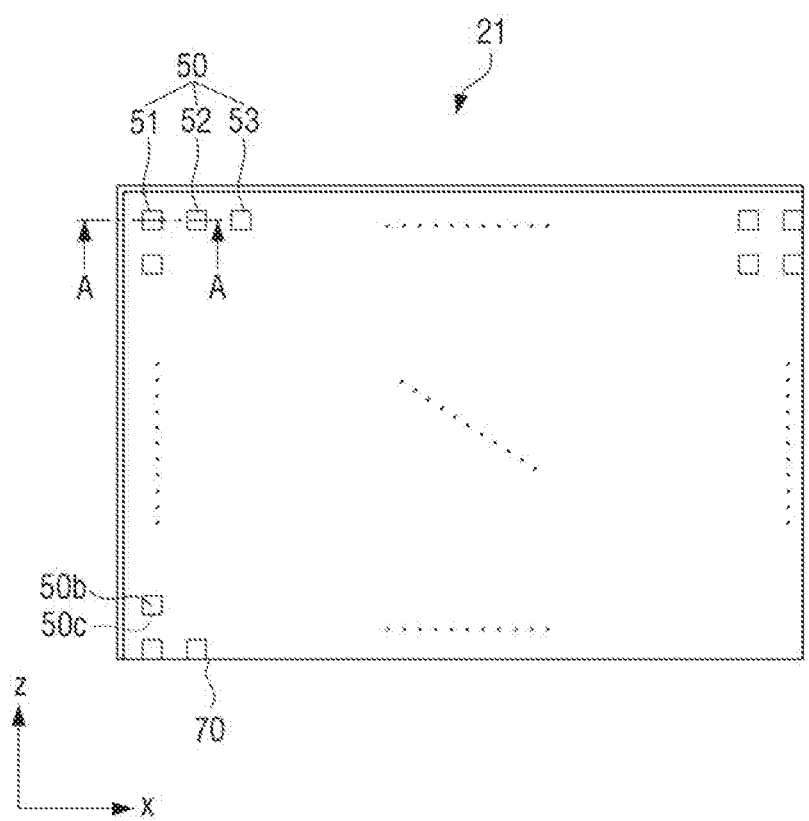
FIG. 2 is a top view illustrating a display module according to an embodiment.
Figure 3:
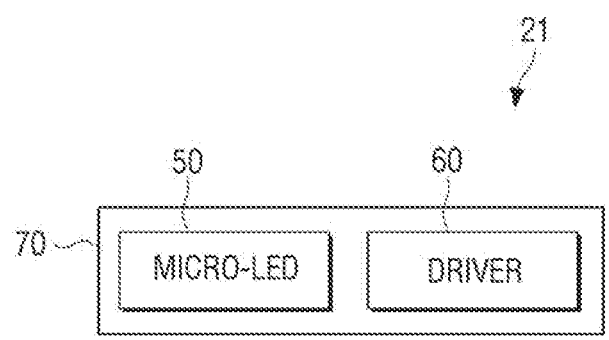
FIG. 3 is a block diagram illustrating an operation of the display module according to an embodiment.

FIG. 2 is a top view illustrating a display module 21 according to an embodiment of the disclosure, and FIG. 3 is a block diagram illustrating an operation of the display module 21.

Here, the display modules 20 are included in plural, but the following description will be based on a single display module 21 for convenience of explanation.

The first display module 21 may include micro light-emitting diodes (micro-LEDs) 50, a substrate 70 on which the micro-LEDs 50 are disposed in a lattice form, and a driver 60 driving each of the micro-LEDs 50.

The micro-LEDs 50 may be comprised of an inorganic light-emitting material having a size of less than or equal to 100 micrometer (μm) in width, length, and height, respectively, may be disposed on the substrate 70, and may be configured to radiate light.

The micro-LEDs 50 may include a first micro-LED 51 configured to emit red light, a second micro-LED 52 configured to emit green light, and a third micro-LED 53 configured to emit blue light.

The first to third micro-LEDs 51, 52, and 53 may be sequentially disposed on the substrate 70.

Accordingly, the first to third micro-LEDs 51, 52, and 53 may form a single pixel and may implement various colors.

As shown in FIG. 2, the first to third micro-LEDs 51, 52, and 53, which are sub-pixels, may be sequentially disposed on the substrate 70, however the first to third micro-LEDs 51, 52, and 53 may also be formed as a single pixel.

Even if the first to third micro-LEDs 51, 52, and 53 form a single pixel, the structures of a reflective layer 90 and a light blocking layer 100, which will be described in more detail elsewhere herein, may be the same.

The micro-LED 50 has been described as a light-emitting device of a next generation display because of its fast response speed, low power consumption, and high luminance. Specifically, the micro-LED 50 is more efficient in converting electricity into photons than conventional liquid crystal displays (LCDs) or organic light emitting diodes (OLEDs).

That is, the micro-LED 50 has a higher "brightness per watt" than the conventional LCD or OLED displays. As a result, the micro-LED 50 consumes substantially half of the energy required by the conventional LED or OLED displays to produce the same brightness.

Furthermore, the micro-LED 50 may implement a high resolution, an excellent color, a high contrast, and a high brightness, thereby accurately expressing a wide range of colors and also implementing a clear screen even in bright sunlight in outdoor environments. In addition, the micro-LED 50 is resistant to burn-in phenomena and generates less heat, thereby providing improved product lifespan without deformation.

The substrate 70 may be electrically connected to each of the micro-LEDs 50 mounted on the substrate 70 in a matrix form, thereby permitting control of the micro-LED 50 via a driving signal of the driver 60.

The substrate 70 may be a thin film transistor (TFT) substrate, a printed circuit board (PCB), a flexible printed circuit board (flexible PCB), or any combinations thereof.

In addition, the substrate 70 may be comprised of various materials, such as a flexible material, glass, or plastic.

The driver 60 may control each of the micro-LEDs 50, and may be bonded to an edge region of the substrate 70 or a rear surface of the substrate 70 by a chip on glass (COG) bonding method or a film on glass (FOG) bonding method to be connected to a substrate 70.

The position at which the driver 60 is disposed on the substrate 70 and the coupling method are not limited thereto, and may be implemented in various ways.

Hereinafter, a structure in which the reflective layer 90 and the light blocking layer 100 are formed according to an embodiment of the disclosure will be described with reference to FIG. 4.

Figure 4:
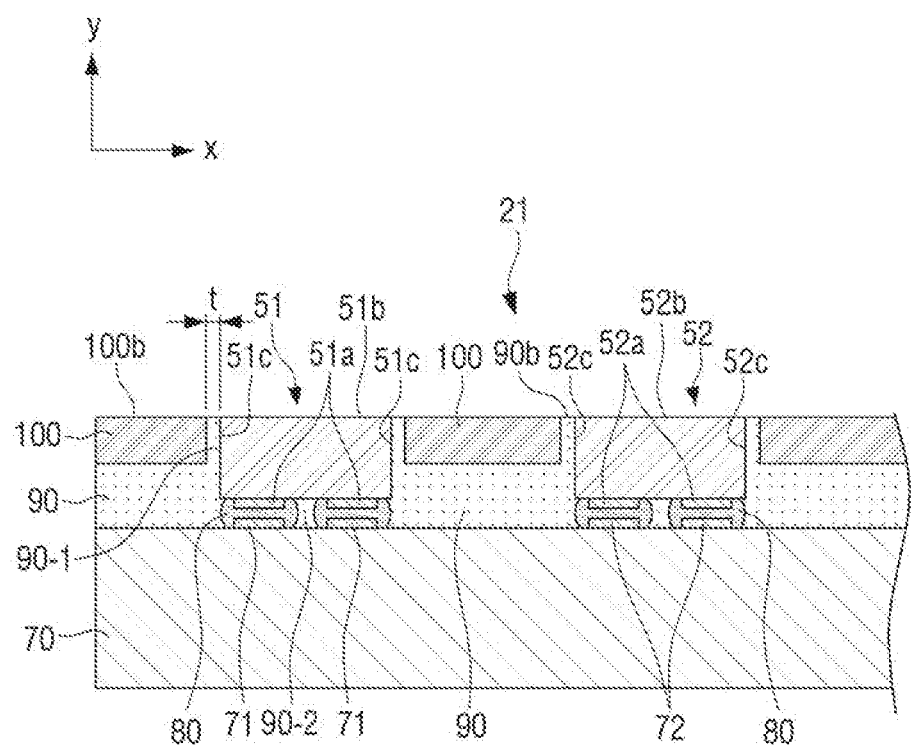
FIG. 4 is a cross-sectional view taken along the line A-A of FIG. 2 according to an embodiment.

FIG. 4 is a cross-sectional view taken along the line A-A of FIG. 2.

As illustrated in FIG. 4, the display module 21 may include a substrate 70, a plurality of micro-LEDs 50 disposed on the substrate 70 to radiate light, a reflective layer 90 surrounding a lateral surface of each of the plurality of micro-LEDs 51 and 52 to reflect side light from each of the plurality of micro-LEDs 51 and 52, and a light blocking layer 100 disposed on the reflective layer 90.

A plurality of micro-LEDs 50 may be disposed on the substrate 70, however the following description will be based on a structure in which the first and second micro-LEDs 51 and 52 are disposed on the substrate 70 for convenience of explanation. Therefore, the structure in which the plurality of micro-LEDs 50 are disposed on the substrate 70 may be substantially the same as the structure in which the first and second micro-LEDs 51 and 52 are disposed on the substrate 70.

The reflective layer 90 may be formed of a material having a predetermined light reflectance, and may include a first portion 90-1 surrounding a lateral surface 50c of the micro-LED 50, and a second portion 90-2 filling spaces between a plurality of electrode pads 51a of the micro-LEDs 50, connection pads 71 of the substrate 70, and a plurality of soldering members 80.

Specifically, the reflective layer 90 may be disposed on the substrate 70 to surround lateral surfaces of the first and second micro-LEDs 51 and 52 that are disposed on the substrate 70. That is, the first portion 90-1 of the reflective layer 90 may contact the lateral surfaces 50c of the micro-LEDs 50 to cover the lateral surfaces 50c of the micro-LEDs 50.

For example, the lateral surface 51c of the first micro-LED 51 and the lateral surface 52c of the second micro-LED 52 may be covered by the first portion 90-1 of the reflective layer 90.

Accordingly, the side light SL radiated from the lateral surfaces of the micro-LEDs 50 may be reflected by the reflective layer 90 that permit the light to be radiated towards an upper surface 50b of the micro-LED 50. That is, the side light SL may be reflected by the first portion 90-1 of the reflective layer 90, and radiated towards the upper surface 50b of the micro-LED 50.

For example, as illustrated in FIG. 4, the side light SL radiated from the lateral surface 51c of the first micro-LED 51 may be reflected by the reflective layer 90, and radiated towards an upper surface 51b of the first micro-LED 51.

Accordingly, the side light SL generated from the lateral surface of the micro-LED 50 may be re-directed by the reflective layer 90 towards the direction in which the light is radiated from the upper surface 50b of the micro-LED 50, thereby increasing a luminance of the display screen.

In addition, the light from each of the first to third micro-LEDs 51, 52, and 53 implementing the red (R), green (G), and blue (B) colors may be increased, thereby improving chromaticness and colorfulness of the display screen, and reducing power consumption for implementing the same level of luminance.

Furthermore, the reflective layer 90 may be configured to have a predetermined thermal conductivity. Accordingly, the heat generated from the micro-LED 50 may be conducted to the lateral surface thereof by the reflective layer 90 disposed on the lateral surface 50c of the micro-LED 50, thereby increasing the heat conduction efficiency.

For example, the lateral surface 51c of the first micro-LED 51 may contact the first portion 90-1 of the reflective layer 90, and the heat generated from the lateral surface 51c of the first micro-LED 51 may be transferred via the first portion 90-1 of the reflective layer 90.

Accordingly, the reflective layer 90 permits effective radiation of the heat generated from the micro-LED 50, thereby reducing the amount of damage to the micro-LED and/or the electronic components disposed near the micro-LED.

In addition, the first portion 90-1 of the reflective layer 90 may be formed to have a first thickness t surrounding the lateral surface of the micro-LED 50. Accordingly, the first portion 90-1 of the reflective layer 90 may stably fix the lateral surface of the micro-LED 50. Further, the first portion 90-1 may be integrally formed with the second portion 90-2 of the reflective layer 90, thereby stably fixing the micro-LED 50 on the substrate 70.

Therefore, the first thickness t may be variously formed to permit the side light SL from the micro-LED 50 to be reflected and the micro-LED 50 to be stably supported.

The reflective layer 90 may be comprised of boron nitride. Boron nitride is a hard ceramic material that is white, has a predetermined light reflectance, is non-conductive, has a high thermal conductivity, and is resistant to thermal shock.

Accordingly, the reflective layer 90 may reflect the side light SL from the micro-LED 50, thereby improving a luminance of the display screen, and at the same time, efficiently radiating heat generated from the micro-LED 50 based on its high thermal conductivity.

Further, the reflective layer 90 may include a material having a predetermined light reflectance such as $TiO_2$ or $Si_3N_4$.

In addition, the reflective layer 90 may be disposed to expose the upper surfaces 50b of the plurality of micro-LEDs 50. For example, the first portion 90-1 of the reflective layer 90 may be disposed so as to not cover the upper surfaces 51b and 52b of the first and second micro-LEDs 51 and 52.

An upper surface 90b of the reflective layer 90 may be disposed on a level that is equal to or lower than the upper surfaces 50b of the plurality of micro-LEDs 50. For example, a height from the substrate 70 to the upper surface 90b of the reflective layer 90 may be less than or equal to a height from the substrate 70 to the upper surface 51b of the first micro-LED 51.

Accordingly, the reflective layer 90 may reflect the side light SL from the micro-LED 50 toward the upper surface of the micro-LED 50, while not blocking the light radiated from the upper surface 50b of the micro-LED 50, thereby implementing a predetermined luminance of the display screen.

In addition, the reflective layer 90 may fill spaces between the plurality of soldering members 80 electrically connecting the plurality of micro-LEDs 50 and the substrate 70.

Specifically, in order to electrically connect the micro-LED 50 and the substrate 70, the micro-LED 50 may have a plurality of electrode pads 50a, the substrate 70 may have a plurality of connection pads 71, and the plurality of soldering members 80 may be disposed between the plurality of electrode pads 50a and the plurality of connection pads 71, respectively. Thereby, the micro-LED 50 and the substrate 70 may be electrically connected to each other.

Here, the plurality of electrode pads 50a may be elemental constituents that the plurality of micro-LEDs 50 have in common.

For example, as illustrated in FIG. 4, the plurality of soldering members 80 may be disposed between the plurality of electrode pads 51a of the first micro-LED 51 and the connection pads 71 of the substrate 70 to electrically connect the first micro-LED 51 and the substrate 70 to each other.

The second portion 90-2 of the reflective layer 90 formed of a non-conductive material may fill spaces between the plurality of soldering members 80. Therefore, the reflective layer 90 may prevent an electrical short between the plurality of soldering members 80.

Taking into consideration that the second portion 90-2 of the reflective layer 90 fills a space under the lower surface of the micro-LED 50 and is in contact with the lower surface of the micro-LED 50, the second portion 90-2 of the reflective layer 90 may stably fix the micro-LED 50 on the substrate 70.

That is, based on the structure in which the reflective layer 90 is integrally formed to surround the lateral surface and the lower surface of the micro-LED 50, excluding the upper surface of the micro-LED 50, various physical characteristics of the reflective layer 90 may easily be used.

For example, since the reflective layer 90 has a predetermined light reflectance, it is possible to reflect the side light SL from the micro-LED 50 towards the upper surface of the micro-LED 50. Since the reflective layer 90 has a high thermal conductivity, it is possible to efficiently radiate the heat generated from the micro-LED 50. Since the reflective layer 90 is comprised of a hard ceramic material that is resistant to thermal shock, it is possible to stably fix the micro-LED 50 on the substrate 70, and at the same time, it is possible to protect the micro-LED 50 from external impacts.

The light blocking layer 100 may be formed between the plurality of micro-LEDs 50 to absorb external light and improve a contrast ratio of the display screen.

Specifically, the light blocking layer 100 may be formed on the reflective layer 90 filled between the plurality of micro-LEDs 50. Thus, the reflective layer 90 and the light blocking layer 100 may be sequentially stacked between the plurality of micro-LEDs 50.

Accordingly, the light blocking layer 100 may separate the first to third micro-LEDs 51, 52, and 53, each emitting light of different color, thereby preventing the colors from being mixed, and may absorb external light, thereby improving a contrast ratio.

In addition, the light blocking layer 100 may be formed to fill a space formed in the first portion 90-1 of the reflective layer 90. That is, the light blocking layer 100 may be disposed between the plurality of micro-LEDs 50 surrounded by the reflective layer 90.

Accordingly, the upper surfaces 50*b* of the micro-LEDs 50 disposed on the substrate 70, the upper surface 90*b* of the reflective layer 90, and an upper surface 100*b* of the light blocking layer 100 may be planarized.

Therefore, when a protective plate 10 is disposed on and contacts the upper surfaces 50*b* of the micro-LEDs 50, the upper surface 90*b* of the reflective layer 90, and the upper surface 100*b* of the light blocking layer 100, the micro-LEDs 50, the reflective layer 90, and the light blocking layer 100 may be stably fixed to the protective plate 10.

The light blocking layer 100 may also be disposed to expose the upper surfaces 50*b* of the plurality of micro-LEDs 50. Accordingly, the light blocking layer 100 might not absorb light radiated from the upper surfaces 50*b* of the plurality of micro-LEDs 50, thereby implementing the luminance of the display screen.

In addition, the light blocking layer 100 may be comprised of a black matrix photosensitive resin composition for a liquid crystal display including a binder resin, a photo polymerization initiator, a black pigment, and a solvent, or a resin composition including a shielding black pigment.

Hereinafter, the structures of a reflective layer 90' and a light blocking layer 100' according to a modified embodiment of the disclosure will be described with reference to FIG. 5.

Figure 5:
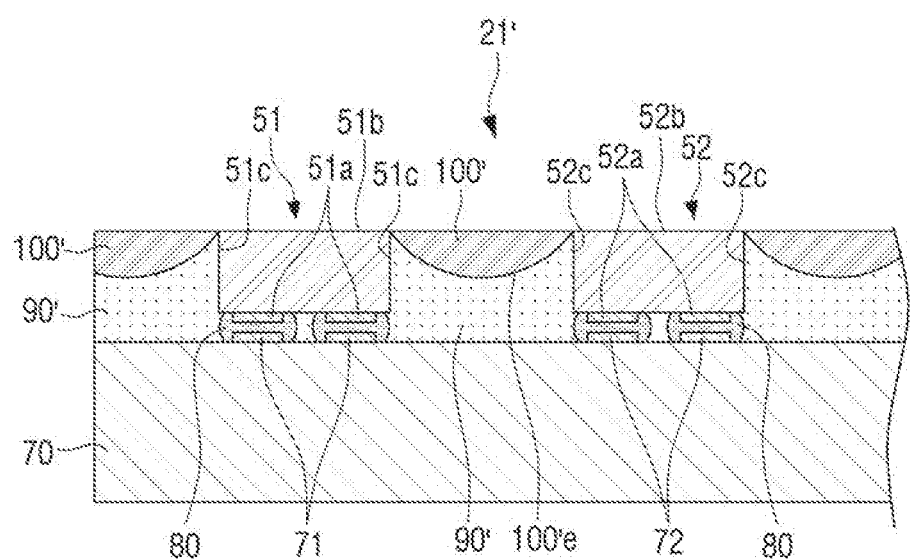
FIG. 5 is a cross-sectional view illustrating a reflective layer and a light blocking layer according to a modified embodiment.

FIG. 5 is a cross-sectional view illustrating a reflective layer 90' and a light blocking layer 100' according to a modified embodiment of the disclosure.

The same elements are denoted by the same reference numerals, and overlapping descriptions thereof may be omitted. Specifically, first and second micro-LEDs 51 and 52 included in a plurality of micro-LEDs 50, a plurality of electrode pads 51*a*, a plurality of connection pads 71, a substrate 70, and a plurality of soldering members 80 may be substantially the same as described above.

The reflective layer 90' may be formed to have a predetermined curved surface 100'*e* between the plurality of micro-LEDs 50, while surrounding lateral surfaces of the plurality of micro-LEDs 50.

Specifically, when the reflective layer 90' is comprised of boron nitride, the reflective layer 90' may be in a liquid phase at room temperature. In order to form the reflective layer 90', the liquid-phase reflective layer 90' may be injected onto the substrate 70.

At this time, the liquid-phase reflective layer 90' is gradually accumulated on the substrate 70. When the liquid-phase reflective layer 90' contacts a lateral surface 50*c* of the micro-LED 50, the reflective layer 90' may have a height that is greater at a portion adjacent to the lateral surface 50*c* of the micro-LED 50 due to surface tension.

Accordingly, when the reflective layer 90' is formed as illustrated in FIG. 5, the reflective layer 90' an additional polishing process might not be required, thereby improving the manufacturing process, and at the same time, the reflective layer 90' may reflect the side light SL from the micro-LED 50, thereby improving a luminance of the display screen.

The light blocking layer 100' may be disposed between the plurality of micro-LEDs 50 and may be formed on the reflective layer 90'. As a result, the light blocking layer 100' may absorb external light and improve a contrast ratio of the display screen.

Hereinafter, the structures of a reflective layer 90" and a light blocking layer 100" according to another modified embodiment of the disclosure will be described with reference to FIG. 6.

Figure 6:
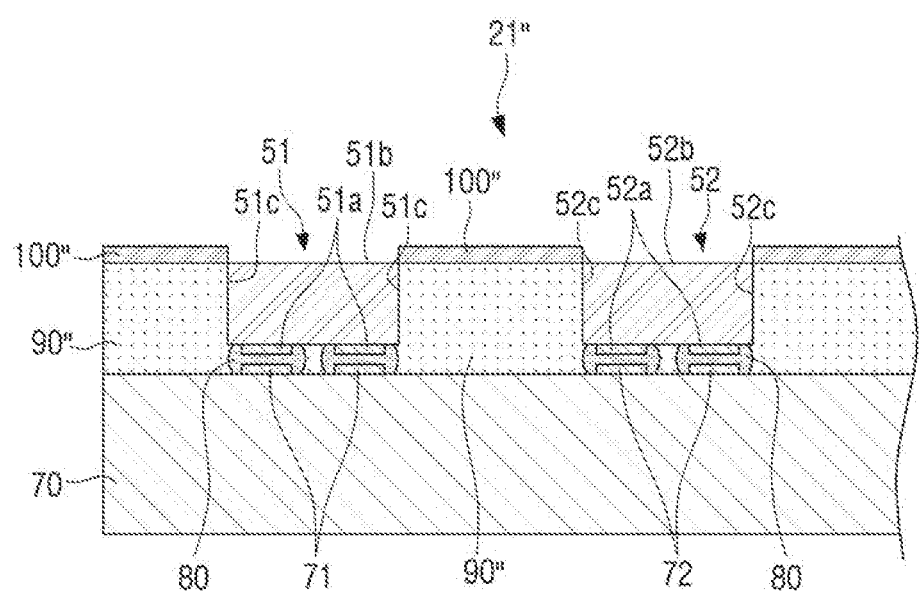
FIG. 6 is a cross-sectional view illustrating a reflective layer and a light blocking layer according to another modified embodiment.

FIG. 6 is a cross-sectional view illustrating a reflective layer 90" and a light blocking layer 100" according to a modified embodiment of the disclosure.

The same elements are denoted by the same reference numerals, and overlapping descriptions thereof may be omitted. Specifically, first and second micro-LEDs 51 and 52 included in a plurality of micro-LEDs 50, a plurality of electrode pads 51*a*, a plurality of connection pads 71, a substrate 70, and a plurality of soldering members 80 may be substantially the same as described above.

When the plurality of micro-LEDs 50 are arranged on the substrate 70 in a lattice form, the reflective layer 90" may be formed to have the same height as upper surfaces 50*b* of the plurality of micro-LEDs 50.

In addition, the light blocking layer 100" may be formed in a matrix form on the upper surface of the reflective layer 90" filled between the plurality of micro-LEDs 50 arranged in the lattice form. That is, the reflective layer 90" may be disposed to fill spaces between the plurality of micro-LEDs 50, and the light blocking layer 100" may be disposed on the upper surface of the reflective layer 90".

Accordingly, the reflective layer 90" may integrally surround entire lateral surfaces 50*c* of the plurality of micro-LEDs 50, thereby reflecting the side light SL from the micro-LEDs 50 and, at the same time, radiating heat from the micro-LEDs 50 and more stably fixing the micro-LEDs 50 on the substrate 70.

In addition, the light blocking layer 100" may absorb external light and improve a contrast ratio of the display screen.

Hereinafter, the structure of the reflective layer 90 in relation to a plurality of display modules 21 and 22 will be described in detail with reference to FIGS. 7A to 8.

Figure 7A:
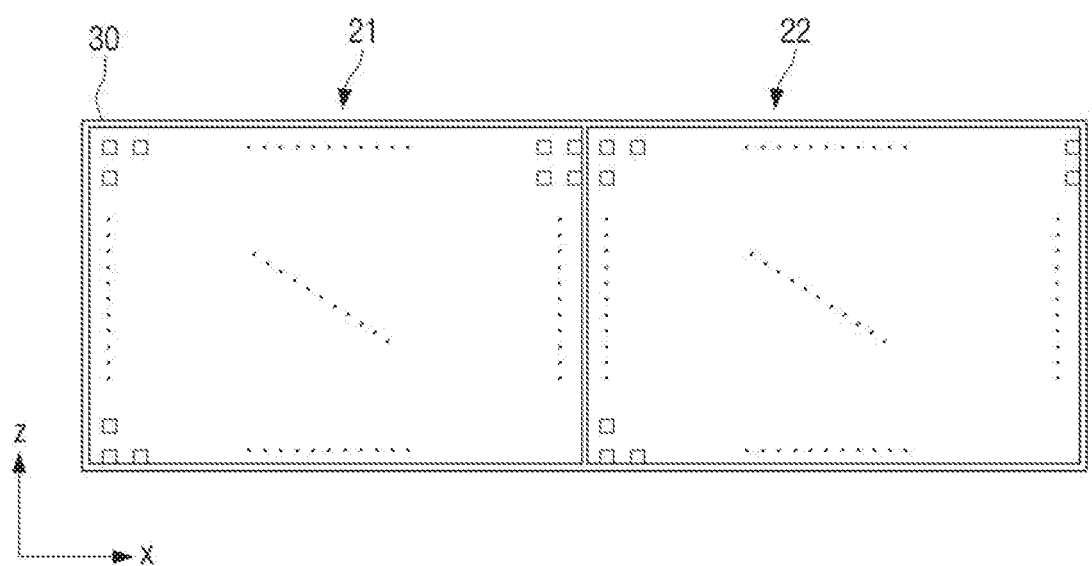
FIG. 7A is a top view illustrating a plurality of display modules arranged according to an embodiment.
Figure 7B:
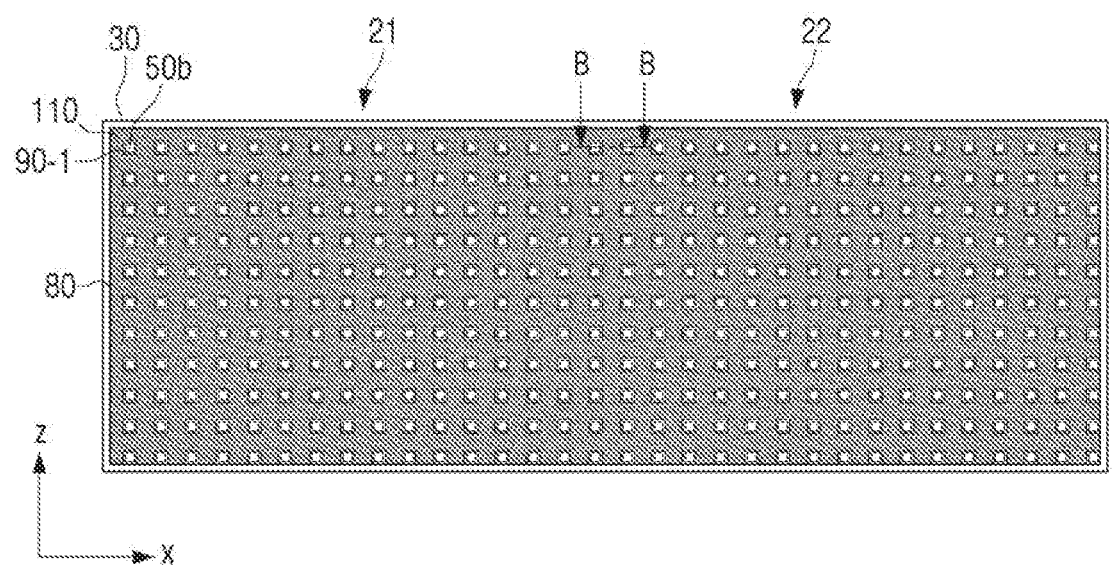
FIG. 7B is a top view illustrating a reflective layer formed on the upper surface of FIG. 7A according to an embodiment.
Figure 8:
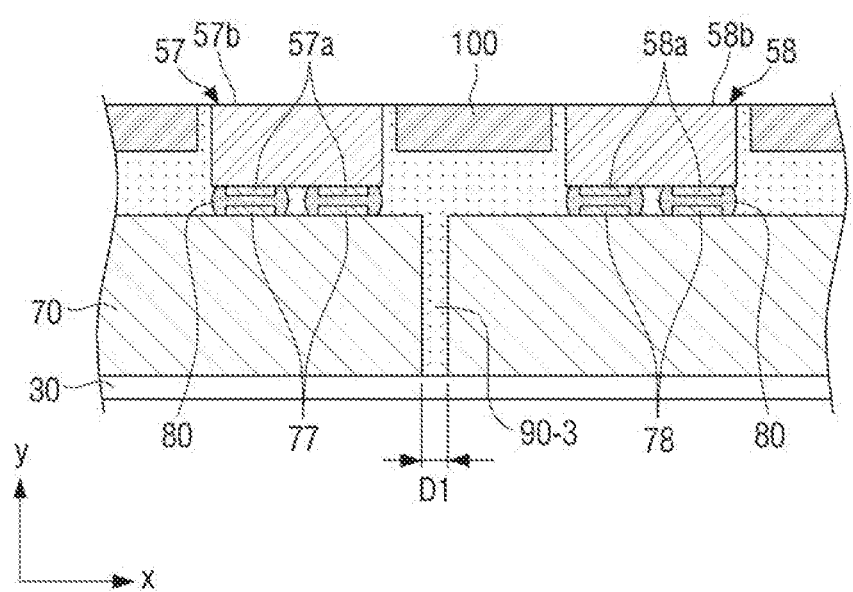
FIG. 8 is a cross-sectional view taken along the line B-B of FIG. 7B according to an embodiment.

FIG. 7A is a top view illustrating a plurality of display modules 21 and 22 arranged according to an embodiment of the disclosure, FIG. 7B is a top view illustrating a reflective layer 90 formed on the upper surface of FIG. 7A, and FIG. 8 is a cross-sectional view taken along the line B-B of FIG. 7B.

Here, micro-LEDs 57 and 58 may be substantially the same as the micro-LEDs 51, 52 and 53 described above, and the colors of light emitted from the micro-LEDs 57 and 58 may vary. In addition, a plurality of connection pads 77 and 78 and a plurality of electrode pads 57*a* and 58*a* may be substantially the same as the plurality of connection pads 71 and 72 and the plurality of electrode pads 51*a* and 52*a* described above.

As illustrated in FIG. 7A, first and second display modules 21 and 22 may be manufactured in the form of a module having a predetermined size, and the first and second display modules 21 and 22 may be arranged on an array plate 30 to thereby implement a display screen in various sizes and forms.

Thereafter, as illustrated in FIG. 7B, a reflective layer 90 may be formed on the array plate 30 and the first and second display modules 21 and 22 disposed on the array plate 30.

At this time, as illustrated in FIG. 8, the reflective layer 90 may include a third portion 90-3 filling a space D1 between the first and second display modules 21 and 22.

The third portion 90-3 may be integrally formed on the array plate 30 and the first and second display modules 21 and 22 disposed on the array plate 30.

That is, the third portion 90-3 of the reflective layer 90 formed on each of the plurality of display modules 21 and 22 may be integrally formed.

Accordingly, when the reflective layer 90 is cured, the reflective layer 90 may fix the plurality of display modules 21 and 22 at predetermined positions of the array plate 30.

In addition, the first portion 90-1, the second portion 90-2, and the third portion 90-3 of the reflective layer 90 may be integrally formed. Accordingly, the reflective layer 90 may structurally fix the plurality of micro-LEDs 50 and the plurality of display modules 20.

The light blocking layer 100 may be formed above the space D1 between the first and second display modules 21 and 22.

Accordingly, the light blocking layer 100 may fill or cover a portion corresponding to a seam that may appear on the display screen due to the space D1 between the first and second display modules 21 and 22, thereby covering the seam on the display screen so as to be seamless.

In addition, as illustrated in FIG. 7B, since the reflective layer 90 and the light blocking layer 100 are disposed to expose the upper surfaces 50*b* of the plurality of micro-LEDs 50, it is possible to prevent light emitted from the upper surfaces 50*b* of the plurality of micro-LEDs 50 from being blocked.

Hereinafter, a process of manufacturing a display module 20 according to an embodiment of the disclosure will be described in detail with reference to FIGS. 9 to 11.

Figure 9:
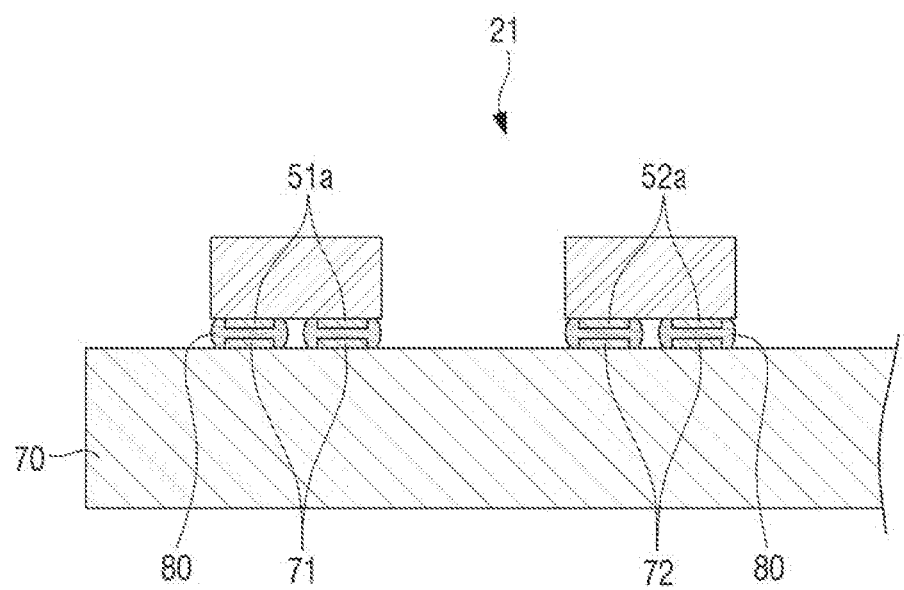
FIG. 9 is a schematic cross-sectional view illustrating a manufacturing process of a display module according to an embodiment.
Figure 10A:
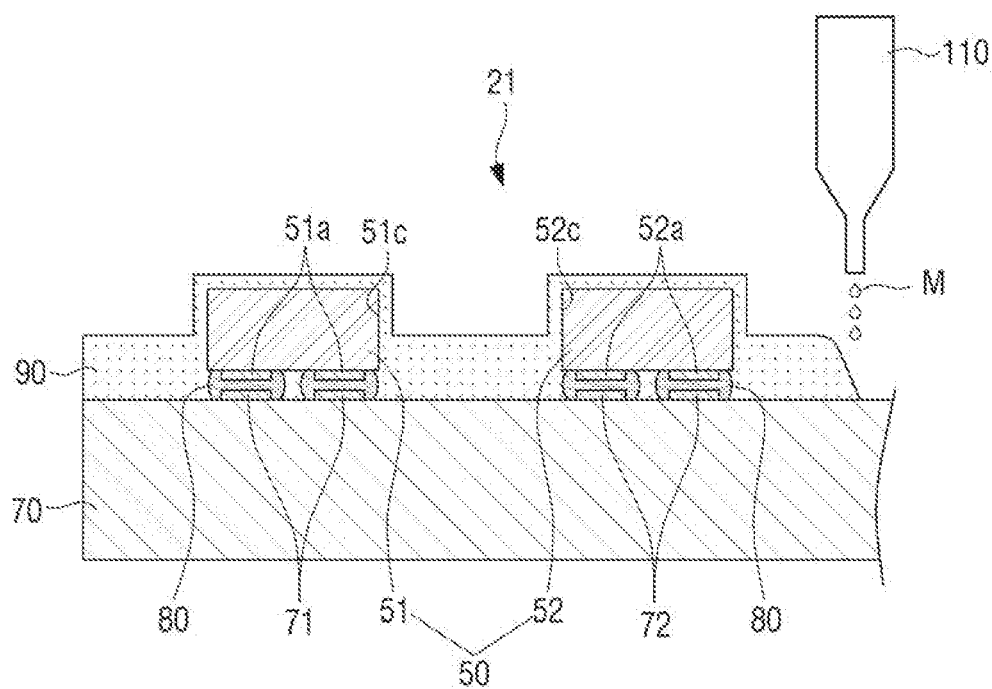
FIG. 10A is a schematic cross-sectional view illustrating a manufacturing process of a display module according to an embodiment.
Figure 10B:
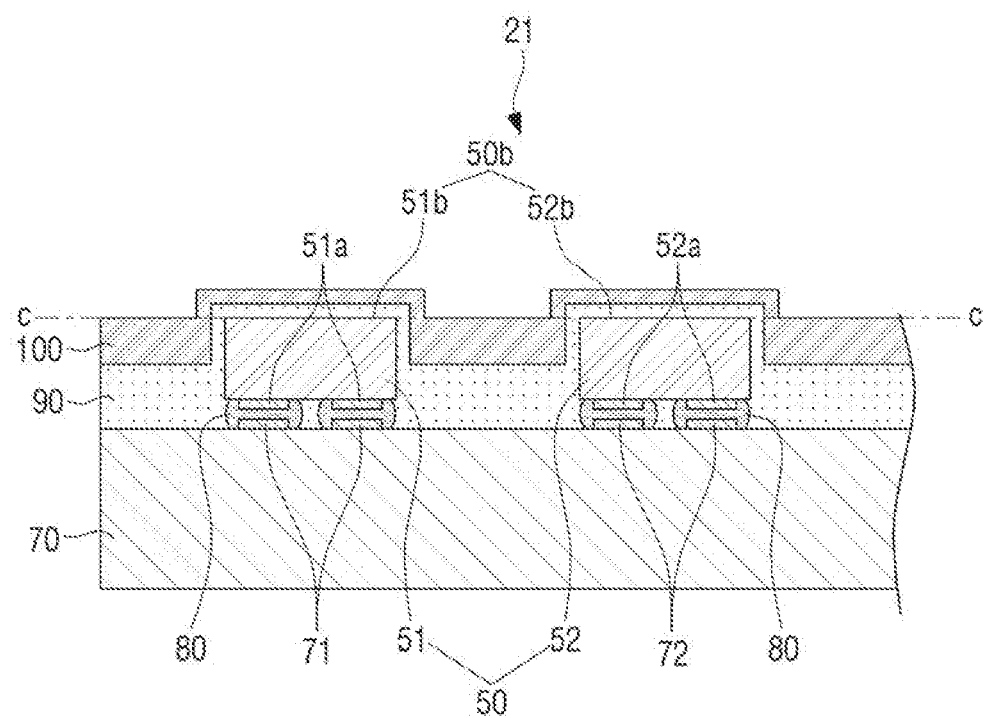
FIG. 10B is a schematic cross-sectional view illustrating a manufacturing process of a display module according to an embodiment.
Figure 11:
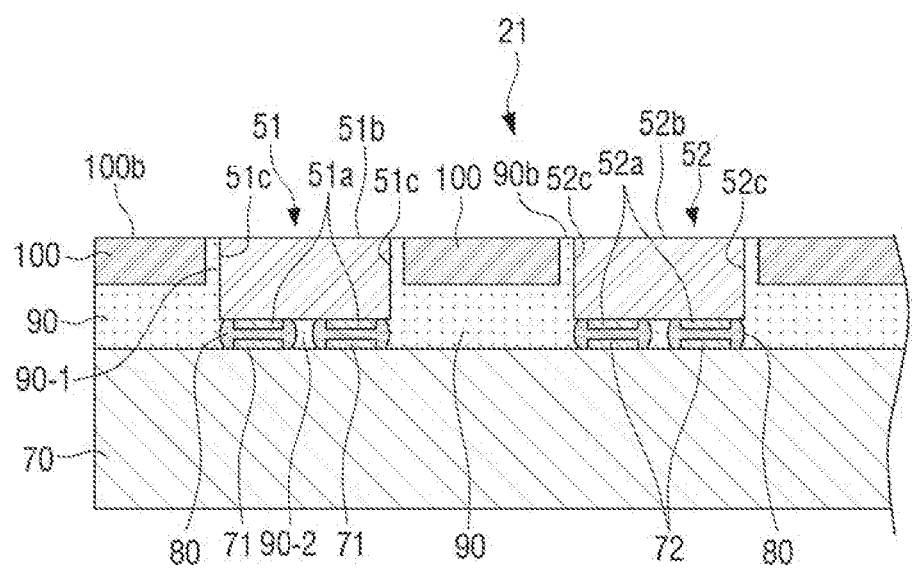
FIG. 11 is a schematic cross-sectional view illustrating a manufacturing process of a display module according to an embodiment.

FIGS. 9 to 11 are schematic cross-sectional views illustrating a process of manufacturing a display module 20 according to an embodiment of the disclosure.

As illustrated in FIG. 9, a plurality of micro-LEDs 50 may be disposed on a substrate 70. For example, first and second micro-LEDs 51 and 52 may be disposed on the substrate 70 at a predetermined distance.

At this time, a plurality of soldering members 80 may be disposed between a plurality of electrode pads 51*a* and 52*a* of each micro-LED 50 and a plurality of connection pads 71 and 72 of the substrate 70, respectively. Accordingly, the plurality of micro-LEDs 50 and the substrate 70 may be electrically and physically connected to each other.

Thereafter, as illustrated in FIG. 10A, a reflective layer 90 may be formed on the substrate 70 to surround a lateral surface of each of the plurality of micro-LEDs 50. That is, the liquid-phase state reflective layer 90 may be applied onto the substrate 70 and the plurality of micro-LEDs 50 disposed on the substrate 70.

In addition, the reflective layer 90 may be applied in a liquid phase M onto the substrate 70 and the plurality of micro-LEDs 50 through a dispenser 110 so as to completely surround the plurality of micro-LEDs 50.

Here, the dispenser 110 may form the reflective layer 90, while moving above the substrate 70 in a predetermined direction.

In addition, the reflective layer 90 may be integrally applied onto the substrate 70 and the plurality of micro-LEDs 50.

In a state where the reflective layer 90 has been applied onto the substrate 70 to surround the plurality of micro-LEDs 50, the reflective layer 90 may be heat-cured by applying heat to the reflective layer 90.

Thereafter, as illustrated in FIG. 10B, a light blocking layer 100 may be formed on the heat-cured reflective layer 90. Here, the light blocking layer 100 may be applied in a liquid-phase state, and may then be thermally cured and solidified.

Next, the portions above the plurality of micro-LEDs 50 may be polished so that the upper surfaces 50*b* of the plurality of micro-LEDs 50 are exposed. Specifically, the polishing may be performed such that the respective upper surfaces of the micro-LEDs 50, the reflective layer 90, and the light blocking layer 100 are planarized.

For example, on the basis of the line C of FIG. 10B corresponding to the upper surfaces 50*b* of the plurality of micro-LEDs 50, the portions of the reflective layer 90 and the light blocking layer 100 formed above the line C may be removed.

At this time, a chemical mechanical polishing (CMP) process may be used for the polishing process.

Accordingly, as illustrated in FIG. 11, it may be implemented that the reflective layer 90 surrounds the lateral surfaces 50*c* of the plurality of micro-LEDs 50 in the state where the upper surfaces 50*b* of the plurality of micro-LEDs 50 are exposed.

Hereinafter, a manufacturing process for forming the reflective layer 90' and the light blocking layer 100' according to the modified embodiment of the disclosure illustrated in FIG. 5 will be described with reference to FIGS. 12A and 12B.

Figure 12A:
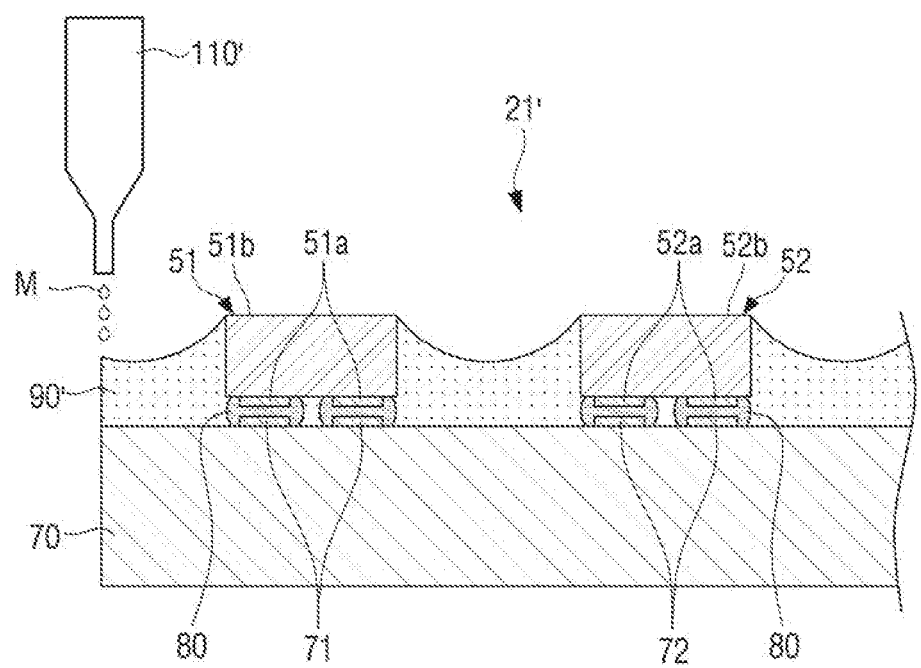
FIG. 12A is a schematic cross-sectional view illustrating a manufacturing process of a display module according to a modified embodiment and FIG. 12B is a schematic cross-sectional view illustrating a manufacturing process of a display module according to a modified embodiment.
Figure 12B:
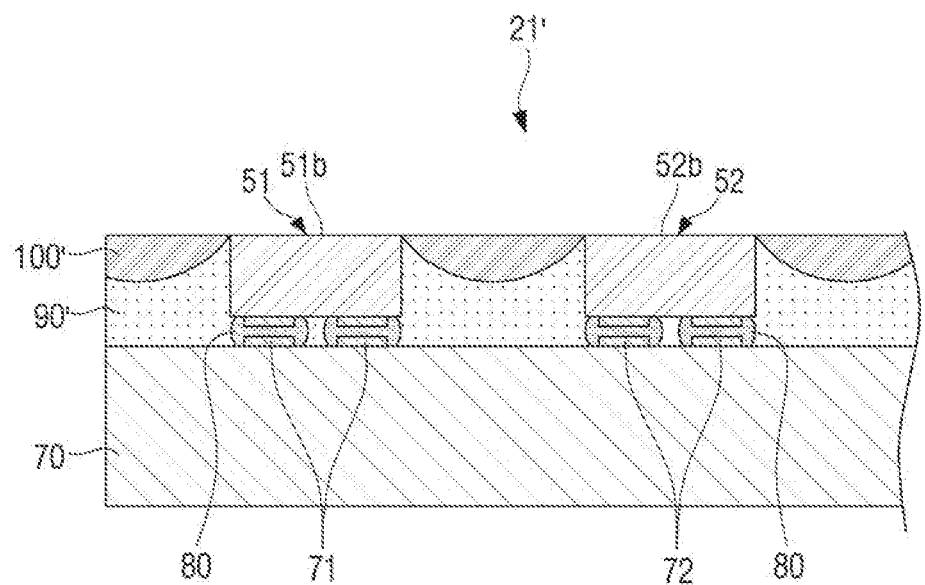

FIGS. 12A and 12B are schematic cross-sectional views illustrating a process of manufacturing a display module 21' according to a modified embodiment of the disclosure.

As illustrated in FIG. 12A, the liquid-phase reflective layer 90' may be applied onto the substrate 70 and the plurality of micro-LEDs 50 mounted on the substrate 70 through a dispenser 110'.

At this time, the dispenser 110' may continuously inject the liquid-phase reflective layer 90' onto a portion of the substrate 70.

The reflective layer 90' may be gradually higher from the upper surface 70*b* of the substrate 70, and filled to surround the micro-LED 50 from a lower portion of the micro-LED 50.

Accordingly, the reflective layer 90' is gradually accumulated on the substrate 70. When the liquid-phase reflective layer 90' is in contact with the lateral surface 50*c* of the micro-LED 50, the reflective layer 90' may have a height that is greater at a portion adjacent to the lateral surface 50c of the micro-LED 50 due to surface tension.

Accordingly, when the reflective layer 90' is formed as illustrated in FIG. 12B, the reflective layer 90' might not require an additional polishing process, thereby improving the manufacturing process, and at the same time, the side light SL from the micro-LED 50 may be reflected, thereby improving a luminance of the display screen.

As shown in FIG. 12B, light blocking layer 100' may be disposed between the plurality of micro-LEDs 50 and may be formed on the reflective layer 90'. As a result, the light blocking layer 100' may absorb external light and improve a contrast ratio of the display screen.

Although the various embodiments of the disclosure have been individually described hereinabove, each embodiment is not necessarily implemented alone, and the configuration and operation of each embodiment may be implemented in combination with at least one other embodiment.

In addition, although the embodiments of the disclosure have been illustrated and described hereinabove, the disclosure is not limited to the specific embodiments as described above, and may be variously modified by those skilled in the art to which the disclosure pertains without departing from the spirit of the disclosure as disclosed in the accompanying claims.

What is claimed is:

1. A display module comprising:
   a substrate;
   a plurality of micro light-emitting diodes (micro-LEDs) disposed on the substrate, and configured to radiate light;
   a reflective layer including a first portion surrounding a lateral surface of each of the plurality of micro-LEDs, and a second portion that is provided between a top surface of the substrate and bottom surfaces of the plurality of micro-LEDs and that directly contacts the bottom surfaces, of the plurality of micro-LEDs, that are parallel to the top surface of the substrate; and
   a light blocking layer disposed on the reflective layer.

2. The display module as claimed in claim 1, wherein the reflective layer is comprised of boron nitride.

3. The display module as claimed in claim 1, wherein the reflective layer and the light blocking layer are disposed to expose upper surfaces of the plurality of micro-LEDs.

4. The display module as claimed in claim 1, wherein an entire upper surface of the reflective layer is lower than or planar with upper surfaces of the plurality of micro-LEDs.

5. The display module as claimed in claim 1, further comprising:
   a plurality of soldering members configured to electrically connect the plurality of micro-LEDs and the substrate, wherein the reflective layer is formed on the substrate to fill spaces between the plurality of soldering members.

6. The display module as claimed in claim 1, wherein the light blocking layer is disposed on the reflective layer between the plurality of micro-LEDs.

7. The display module as claimed in claim 6, wherein the reflective layer is disposed to fill spaces between the plurality of micro-LEDs, and
   the light blocking layer is disposed on an upper surface of the reflective layer.

8. The display module as claimed in claim 1, wherein the light blocking layer is disposed between the plurality of micro-LEDs that are surrounded by the reflective layer.

9. The display module as claimed in claim 1, wherein the plurality of micro-LEDs includes:
   a first micro-LED configured to emit red light;
   a second micro-LED configured to emit green light; and
   a third micro-LED configured to emit blue light.

10. The display module as claimed in claim 9, wherein the first micro-LED, the second micro-LED, and the third micro-LED are disposed sequentially on the substrate.

11. A display apparatus comprising:
    a plurality of display modules;
    an array plate configured to support the plurality of display modules to permit the plurality of display modules disposed on the same plane in parallel with each other; and
    a housing configured to fix the plurality of display modules and the array plate,
    wherein each of the plurality of display modules includes:
    a substrate;
    a plurality of micro light-emitting diodes (micro-LEDs) disposed on the substrate, and configured to radiate light;
    a reflective layer include a first portion surrounding a lateral surface of each of the plurality of micro-LEDs, and a second portion that is provided between a top surface of the substrate and bottom surfaces of the plurality of micro-LEDs and that directly contacts the bottom surfaces, of the plurality of micro-LEDs, that are parallel to the top surface of the substrate; and
    a light blocking layer disposed on the reflective layer.

12. The display apparatus as claimed in claim 11, wherein the reflective layer is comprised of boron nitride.

13. The display apparatus as claimed in claim 11, wherein the reflective layer and the light blocking layer are disposed to expose upper surfaces of the plurality of micro-LEDs.

14. The display apparatus as claimed in claim 11, wherein the reflective layer fills spaces between the plurality of display modules.

* * * * *